US012291604B2

(12) United States Patent
Funakoshi et al.

(10) Patent No.: US 12,291,604 B2
(45) Date of Patent: May 6, 2025

(54) CURABLE RESIN COMPOSITION, DRY FILM AND CURED PRODUCT THEREOF, AND ELECTRONIC COMPONENT INCLUDING CURED PRODUCT

(71) Applicant: TAIYO HOLDINGS CO., LTD., Saitama (JP)

(72) Inventors: Chihiro Funakoshi, Hiki-gun (JP); Yoko Shibasaki, Hiki-gun (JP)

(73) Assignee: TAIYO HOLDINGS CO., LTD., Hiki-gun (JP)

( * ) Notice: Subject to any disclaimer, the term of this patent is extended or adjusted under 35 U.S.C. 154(b) by 515 days.

(21) Appl. No.: 17/639,153

(22) PCT Filed: Aug. 28, 2020

(86) PCT No.: PCT/JP2020/032716
§ 371 (c)(1),
(2) Date: Feb. 28, 2022

(87) PCT Pub. No.: WO2021/044984
PCT Pub. Date: Mar. 11, 2021

(65) Prior Publication Data
US 2022/0315704 A1  Oct. 6, 2022

(30) Foreign Application Priority Data

Sep. 6, 2019  (JP) ................. 2019-162824
Sep. 6, 2019  (JP) ................. 2019-162827

(51) Int. Cl.
C08F 2/46 (2006.01)
C08F 2/48 (2006.01)
C08F 2/50 (2006.01)
C08F 222/10 (2006.01)
C08F 283/04 (2006.01)
C08G 61/04 (2006.01)
C08G 73/10 (2006.01)
C08G 73/14 (2006.01)
C08J 5/18 (2006.01)
C08L 63/04 (2006.01)

(52) U.S. Cl.
CPC ............ C08G 73/14 (2013.01); C08F 2/48 (2013.01); C08F 222/103 (2020.02); C08F 283/04 (2013.01); C08G 73/1003 (2013.01); C08J 5/18 (2013.01); C08L 63/04 (2013.01); C08L 2201/08 (2013.01); C08L 2201/10 (2013.01); C08L 2203/16 (2013.01); C08L 2203/20 (2013.01); C08L 2205/035 (2013.01)

(58) Field of Classification Search
CPC ........ H05K 3/46; H05K 1/03; C08G 73/1003; C08G 73/14; C08G 73/1035; C08G 18/79; C08G 18/34; G03F 7/027; G03F 7/037; C08J 7/0427; C08J 5/18; C08J 2479/08; C08J 2463/00; C08J 2367/02; C09D 4/06; C08F 2/48; C08F 2/44; C08F 283/045; C08F 283/04; C08F 222/103; C08F 222/1006; C08F 222/1063; C08F 290/14; C08L 63/04; C08L 63/00; C08L 79/08; C08L 2203/16; C08L 2201/10; C08L 2201/08; C08L 2203/20; C08L 2205/035; C08K 3/36; C08K 2003/3045
USPC ................................ 522/170, 168, 1; 520/1
See application file for complete search history.

(56) References Cited

U.S. PATENT DOCUMENTS

2016/0152773 A1    6/2016  Murakami et al.

FOREIGN PATENT DOCUMENTS

| CN | 109312045 A | 2/2019 | |
|---|---|---|---|
| JP | 2000-344889 A | 12/2000 | |
| JP | 2003-221429 A | 8/2003 | |
| JP | 5839149 B2 | 1/2016 | |
| JP | 2017-146426 A | 8/2017 | |
| JP | 2018-109733 A | 7/2018 | |
| TW | 201811872 A | 4/2018 | |
| WO | WO-2017221922 A1 * | 12/2017 | ............. C08G 18/34 |

OTHER PUBLICATIONS

Kuwada et al., WO 2017221922 Machine Translation, Dec. 28, 2017 (Year: 2017).*
International Search Report issued on Nov. 17, 2020 in PCT/JP2020/032716 filed on Aug. 28, 2020, 2 pages.

(Continued)

*Primary Examiner* — Jessica Whiteley
(74) *Attorney, Agent, or Firm* — Oblon, McClelland, Maier & Neustadt, L.L.P.

(57) ABSTRACT

Provided is a curable resin composition having developability and resolution improved without degrading the heat resistance and the chemical resistance, furthermore, a curable resin composition that is useful as a PID material for optical uses or a material for optical sensor protective films and enables the formation of a cured product having both higher transparency and excellent heat resistance, a dry film containing the curable resin composition, a cured product thereof and a printed wiring board including the cured product. A curable resin composition containing (A) an amide-imide resin, (B) a compound having an ethylenic double bond and (C) a photopolymerization initiator, wherein the amide-imide resin (A) is a reaction product of an isocyanurate-type polyisocyanate synthesized from an isocyanate having an aliphatic structure and a tricarboxylic acid anhydride and has a number-average molecular weight of 500 to 1000.

20 Claims, No Drawings

(56) References Cited

OTHER PUBLICATIONS

Taiwanese Office Action dated Nov. 4, 2024, in Taiwanese Patent Application No. 109130206 (5 pages).
Office Action issued Jan. 24, 2025, in corresponding Chinese Patent Application No. 202080060926.3, citing document 15 therein, 6 pages.

* cited by examiner

CURABLE RESIN COMPOSITION, DRY FILM AND CURED PRODUCT THEREOF, AND ELECTRONIC COMPONENT INCLUDING CURED PRODUCT

CROSS-REFERENCE TO RELATED APPLICATIONS

This application is a national stage application of International Application No. PCT/JP2020/032716, filed Aug. 28, 2020, which is based upon and claims the benefit of priority to Japanese Patent Applications No. 2019-162824 filed on Sep. 6, 2019 and No. 2019-162827, filed Sep. 6, 2019. The entire contents of these applications are incorporated herein by reference.

TECHNICAL FIELD

The present invention relates to a curable resin composition, for example, a curable resin composition for an interlayer insulating material that is used in rewiring or the like of a printed wiring board, particularly, a curable resin composition, a dry film and a cured product of a curable resin composition, and an electronic component including the cured product.

In addition, the present invention relates to a curable resin composition for an interlayer insulating material that is useful as a photo imageable dielectric (PID) material for optical uses or a material for optical sensor protective films and is excellent in transparency and heat resistance.

BACKGROUND ART

A variety of characteristics, such as heat resistance, of cured products have been thus far improved by using a curable resin composition containing an amide-imide resin as an interlayer insulating material for printed wiring boards. Particularly, in a case where the amide-imide resin contains a carboxyl group, alkaline development of the coated films of the curable resin composition becomes possible. For example, Patent Document 1 proposes an active energy ray-curable polyimide resin composition containing a polymerizable polyimide resin having a carboxyl group that can be patterned with dilute alkaline aqueous solutions.

Incidentally, in a case where the above-described curable resin composition is used as a PID material for optical uses or a material for optical sensor protective films, it is desirable that cured products to be obtained are more highly transparent. Regarding this point, for example, Patent Document 2 proposes a curable resin composition containing an amide-imide resin having a number-average molecular weight of more than 1000 and describes that cured products that are obtained from the composition are excellent in heat resistance and transparency.

PRIOR ART DOCUMENT

Patent Document

Patent Document 1: JP-A-2003-221429
Patent Document 2: Japanese Patent No. 5839149

SUMMARY OF INVENTION

Problem to be Solved by the Invention

Since there is a desire for a curable resin composition having good developability and resolution, it is conceivable to further contain a large amount of a carboxyl group-containing resin in the curable resin composition containing an amide-imide resin described in Patent Document 1 in addition to the amide-imide resin in order to improve the resolution. However, in this case, there is a tendency for the glass transition temperature (Tg) of a cured product to decrease, and thus there is a case where the chemical resistance of the cured product deteriorates. Particularly, in a case where the cured product is used in a form of being included in a part of a substrate for electronic components, since the substrate surface is cleaned with an acid or an alkali during the production of the substrate or the substrate is cleaned with a solvent during mounting, the chemical resistance of the substrate is essential.

In addition, in a case where the curable resin composition is used as a PID material for optical uses or a material for optical sensor protective films, since the amide-imide resin having a relatively large molecular weight as disclosed in Patent Document 2 cannot be said to have good compatibility with other resins, the resin composition becomes turbid, and there is a problem with the transparency of a cured product to be obtained. As a result, a cured coated film that is obtained even in a case where an amide-imide resin obtained using a carboxylic acid anhydride having a structure with an aromatic ring as one of the raw materials becomes brown, and there is a problem with transparency, which are found by the present inventors.

Therefore, a first objective of the present invention is to provide a curable resin composition having developability and resolution improved without degrading the heat resistance and the chemical resistance, a dry film containing the curable resin composition, a cured product thereof and a printed wiring board including the cured product.

Furthermore, a second objective of the present invention is to provide a curable resin composition that is useful as a PID material for optical uses or a material for optical sensor protective films and enables the formation of a cured product having both higher transparency and more excellent heat resistance.

Means for Solving the Problems

As a result of intensive studies in consideration of the above-described objectives, the present inventors and the like found that a curable resin composition containing
(A) an amide-imide resin,
(B) a compound having an ethylenic double bond, and
(C) a photopolymerization initiator,
in which the amide-imide resin (A) is a reaction product of an isocyanurate-type polyisocyanate synthesized from an isocyanate having an aliphatic structure and a tricarboxylic acid anhydride and has a number-average molecular weight of 500 to 1000 is capable of achieving the above-described first objective and completed the present invention.

Here, the tricarboxylic acid anhydride of the present invention preferably has an aliphatic structure.

In addition, the curable resin composition of the present invention capable of achieving the above-described second objective preferably further contains (E) a carboxyl group-containing resin, and, in this case, the tricarboxylic acid anhydride of the present invention preferably has an aliphatic structure.

The curable resin composition of the present invention preferably further contains (D) a thermosetting resin.

In the curable resin composition of the present invention capable of achieving the above-described second objective, a cured product having a film thickness of 20 um after curing preferably has a total light transmittance of 95% or more and a haze value of less than 2.0%.

In addition, the above-described objectives of the present invention are achieved by a dry film including a resin layer formed of the curable resin composition, a cured product formed by curing the curable resin composition or the resin layer in the dry film, and an electronic component including the cured product.

Effects of Invention

According to the present invention, it is possible to obtain a curable resin composition that is excellent in heat resistance and chemical resistance after curing and has improved in developability and resolution, a dry film thereof, a cured product thereof, and a printed wiring board including the cured product.

Furthermore, the curable resin composition of the present invention is not only excellent in resolution and developability, but a cured product thereof also has good heat resistance, total light transmittance and haze value. Therefore, the curable resin composition is a photolithography type and also useful as a PID material for optical uses or a material for optical sensor protective films.

MODE FOR CARRYING OUT THE INVENTION

A curable resin composition of the present invention contains at least (A) an amide-imide resin, (B) a compound having an ethylenic double bond and (C) a photopolymerization initiator, and the amide-imide resin (A) is a reaction product of an isocyanurate-type polyisocyanate synthesized from an isocyanate having an aliphatic structure and a tricarboxylic acid anhydride and has a number-average molecular weight of 500 to 1000.

The curable resin composition of the present invention has the above-described constitution, and thus, when developed with an alkaline developer, the curable resin composition exhibits excellent developability, and the resolution of a cured product that is obtained from the curable resin composition becomes very good. In addition, the cured product that is obtained from the curable resin composition is also excellent in heat resistance, cured coated film strength and chemical resistance. Therefore, the cured product is meaningful in application for which both delicate resolution and the durability (heat resistance, strength and chemical resistance) of coated films are required, for example, application as an interlayer insulating material for printed wiring boards and the like and insulating materials for rewiring.

Hereinafter, each component of the curable resin composition will be described in detail.

(A) Amide-Imide Resin

The curable resin composition of the present invention contains (A) an amide-imide resin.

The amide-imide resin (A) is a resin that is produced by reacting an isocyanurate-type polyisocyanate synthesized from an isocyanate having an aliphatic structure and a tricarboxylic anhydride, and an amide-imide resin having a number-average molecular weight within a range of 500 to 1000 is used. That is, in the amide-imide resin (A) that is used in the present invention, an imide bond is directly formed from the above-described isocyanurate-type polyisocyanate and tricarboxylic anhydride, which makes it possible to synthesize an amide-imide resin that is good in stability, reproducibility and solubility of the material and excellent in transparency compared with amide-imide resins synthesized by the related art where a polyamic acid intermediate is produced in the middle. In addition, when the number-average molecular weight of the amide-imide resin (A) is set within a range of 500 to 1000, the developability and the resolution particularly improve. Furthermore, when a tricarboxylic acid anhydride having an aliphatic structure is used, a cured product to be obtained becomes suitable for uses as a PID material for optical uses or a material for optical sensor protective films.

Isocyanurate-Type Polyisocyanate

The isocyanurate-type polyisocyanate, which is considered as a synthesis raw material of the amide-imide resin (A), is synthesized from an aliphatic isocyanurate, that is, an aliphatic linear isocyanate (for example, hexamethylene diisocyanate or trimethylhexamethylene isocyanate) or an alicyclic isocyanate (isophorone diisocyanate, hydrogenated tolylene diisocyanate, hydrogenated xylene diisocyanate, norbornane diisocyanate or hydrogenated diphenylmethane diisocyanate).

Specific examples of the isocyanurate-type polyisocyanate are

HDI3N: isocyanurate-type triisocyanate synthesized from hexamethylene diisocyanate, HTMDI3N: isocyanurate-type triisocyanate synthesized from trimethylhexamethylene diisocyanate, IPDI3N: isocyanurate-type triisocyanate synthesized from isophorone diisocyanate, HTDI3N: isocyanurate-type triisocyanate synthesized from hydrogenated tolylene diisocyanate, HXDI3N: isocyanurate-type triisocyanate synthesized from hydrogenated xylene diisocyanate, NBDI3N: isocyanurate-type triisocyanate synthesized from norbornane diisocyanate and HMDI3N: isocyanurate-type triisocyanate synthesized from hydrogenated diphenylmethane diisocyanate.

Each of the above-described triisocyanurates may be used singly or may be used in combination.

The isocyanate that serves as a raw material of the amide-imide resin (A) is preferably an alicyclic isocyanate, particularly, isophorone diisocyanate, and the use of the alicyclic isocyanate particularly improves Tg and makes it possible to obtain cured coated films having excellent thermal properties. In addition, the isocyanate having an aliphatic structure has a structure not including an aromatic ring structure, and thus the amide-imide resin according to the present invention to be obtained is highly transparent.

Tricarboxylic Acid Anhydride

Examples of the tricarboxylic acid anhydride that is another reaction raw material of the amide-imide resin (A) include tricarboxylic acid anhydrides having an aromatic structure, for example, trimellitic anhydride, 1,2,4-benzenetricarboxylic acid 1,2 anhydride and the like and include tricarboxylic acid anhydrides having an aliphatic structure (including an aliphatic linear structure or an alicyclic structure), for example, cyclohexanetricarboxylic anhydride, methylcyclohexanetricarboxylic anhydride, cyclohexenetricarboxylic anhydride, methylcyclohexenetricarboxylic anhydride and the like. The tricarboxylic acid anhydride is preferably a tricarboxylic acid anhydride having an aliphatic structure and, furthermore, more preferably a tricarboxylic acid anhydride having an alicyclic structure since cured coated films having a high Tg and excellent thermal properties in addition to transparency can be obtained. Among them, cyclohexanetricarboxylic anhydride is particularly preferably used. Both the isocyanurate-type polyisocyanate and the tricarboxylic acid anhydride preferably have a structure including no aromatic ring structure. Therefore, the amide-imide resin according to the present invention to be obtained is highly transparent, and furthermore, a cured product to be obtained from the curable resin composition of the present invention containing the amide-imide resin is also highly transparent.

The cyclohexanetricarboxylic anhydride is represented by the following formula (1)

[Chem. 1]

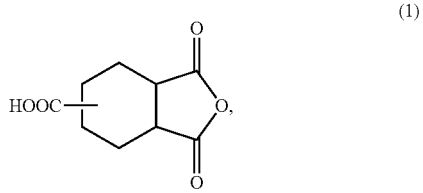

(1)

and, as specific examples thereof, cyclohexane-1,3,4-tricarboxylic acid-3,4-anhydride, cyclohexane-1,3,5-tricarboxylic acid-3,5-anhydride, cyclohexane-1,2,3-tricarboxylic acid-2,3-anhydride and the like, particularly, cyclohexane-1,3,4-tricarboxylic acids-3,4-anhydride, are preferably used.

That is, the use of such an aliphatic tricarboxylic anhydride as a raw material of the amide-imide resin (A) makes the heat resistance of a cured product of the present invention more excellent.

In addition, as the raw material for the production of the amide-imide resin (A), it is also possible to use the tricarboxylic anhydride and, in some cases, jointly use a bifunctional dicarboxylic acid compound, for example, an aliphatic or aromatic dicarboxylic acid, for example, sebacic acid, phthalic acid, fumaric acid, maleic acid, an acid anhydride thereof, or the like.

When a carboxylic acid component of the tricarboxylic anhydride and an isocyanate component in the isocyanurate-type polyisocyanate react with each other, an imide and an amide are formed, and as the resin of the present invention an amide-imide resin is produced. When the isocyanurate-type polyisocyanate and the tricarboxylic anhydride react with each other, an imide bond is formed from an acid anhydride group and an isocyanate group, and an amide bond is formed from a carboxyl group and an isocyanate group. When a tricarboxylic acid anhydride group and a polyisocyanate group are reacted in fractions where a carboxylic acid (carboxyl group) component of the tricarboxylic anhydride is left, a polyamide-imide resin to be obtained has a carboxy group. This carboxy group reacts with a polymerizable group such as an epoxy group of an epoxy resin that is contained in the curable resin composition of the present invention, which will be described below, and forms a crosslinking structure of a cured product. In the reaction between the tricarboxylic anhydride and the triisocyanate, two types of reactions such as amidation and imidization described above can be considered. Since the reaction rate is faster in imidization, tricarboxylic acid selectively forms an imide in a phase of the acid anhydride group.

The isocyanurate-type polyisocyanate synthesized from an isocyanate having an aliphatic structure and the tricarboxylic anhydride having an aliphatic structure are more preferably reacted such that a ratio [(M1)+(M2)/(N)] between the mole number of the isocyanate group of the isocyanurate-type polyisocyanate synthesized from an isocyanate having an aliphatic structure (N) and the total mole number of the mole number of the carboxy group (M1) and the mole number of the acid anhydride group (M2) in the tricarboxylic anhydride becomes 1.1 to 3 since the polarity of the reaction system increases, thereby the reaction smoothly proceeds, no isocyanate group is left, the stability of the resulting polyimide resin is good, the amount of the tricarboxylic anhydride left is also small, a separation problem such as recrystallization is also less likely to be caused, and the like. Particularly, the ratio is more preferably 1.2 to 2. The acid anhydride group in the present invention indicates a —CO—O—CO— group obtained by the intramolecular dehydration condensation of two carboxylic acid molecules.

An imidization reaction is preferably caused by mixing one or more types of isocyanates having an aliphatic structure and one or more types of tricarboxylic anhydrides in a solvent or without a solvent and heating the components under stirring. The reaction temperature is preferably 50° C. to 250° C. and particularly preferably 70° C. to 180° C. As such a reaction temperature is set, the reaction rate is faster, and the effect that side reaction, decomposition or the like is less likely to occur is exhibited. In the reaction, the acid anhydride group and the isocyanate group form an imide group while accompanying decarboxylation. The proceeding of the reaction can be traced with analysis means such as an infrared spectrum, an acid value, and quantitative estimation of the isocyanate group. In the infrared spectrum, 2270 $cm^{-1}$ that is the characteristic absorption of the isocyanate group decreases with the reaction, and furthermore, the acid anhydride group having characteristic absorption at 1860 $cm^{-1}$ and 850 $cm^{-1}$ decreases. On the other hand, the absorption of the imide group increases at 1780 $cm^{-1}$ and 1720 $cm^{-1}$. The reaction may be ended by lowering the temperature while confirming the target acid value, viscosity, molecular weight or the like. However, the reaction is more preferably continued until the isocyanate group disappears from the viewpoint of stability over time or the like. In addition, a catalyst, an antioxidant, a surfactant, other solvents or the like may be added in the middle of the reaction or after the reaction as long as the physical properties of a resin to be synthesized are not impaired.

The acid value of the amide-imide resin of the present invention is preferably 70 to 210 KOHmg/g and particularly preferably 90 to 190 KOHmg/g. When the acid value is 70 to 210 KOHmg/g, excellent performance is exhibited as curing properties.

In addition, the amide-imide resin of the present invention is preferably an amide-imide resin that dissolves in a polar solvent containing neither a nitrogen atom nor a sulfur atom. An example of such an amide-imide resin includes a branched amide-imide resin having a branched structure and an acid value of the resin of 60 KOHmg/g or higher.

The number-average molecular weight Mn of the amide-imide resin (A) in the curable resin composition is in a range of 500 to 1000, preferably, 700 to 900.

In the present invention, since the number-average molecular weight Mn of the amide-imide resin (A) is 500 or more, the heat resistance of cured coated films becomes good, and since the number-average molecular weight Mn is 1000 or less, contrast is likely to be created in developing the curable resin composition, and cured coated films to be obtained also become excellent in resolution.

As the number-average molecular weight in the present invention, unless particularly otherwise described, a measurement result of gel permeation chromatography (GPC) using the polystyrene standard is used.

In the curable resin composition of the present invention capable of achieving the above-described first objective, the content of the amide-imide resin (A) may be 30 to 85 mass %, particularly preferably 40 to 70 mass %, with respect to the total mass of the solid content of the curable resin composition. This is because, when the amount of the amide-imide resin (A) blended is set within this range, the Tg of the curable resin composition improves, and a cured coated film having excellent thermal properties can be obtained.

In addition, in the curable resin composition of the present invention capable of achieving the above-described second objective, the content of the amide-imide resin (A) is preferably 5 to 70 mass % and more preferably, particularly, within a range of 10 to 50 mass % of the total mass of the solid content of the curable resin composition.

(B) Compound Having Ethylenic Double Bond

The curable resin composition of the present invention contains a compound having an ethylenic double bond (B). The compound having an ethylenic double bond (B) is photocured by irradiation with active energy rays to make the resin composition of the present invention insoluble in alkaline aqueous solutions or to be capable of making the resin composition insoluble in alkaline aqueous solutions.

Specific examples of the compound having an ethylenic double bond (B) include monoacrylates having a hydroxyl group such as hydroxyalkyl acrylates such as 2-hydroxyethyl acrylate and 2-hydroxypropyl acrylate;

diacrylates of a glycol such as ethylene glycol, methoxytetraethylene glycol, polyethylene glycol or propylene glycol;

acrylamides such as N,N-dimethylacrylamide, N-methylolacrylamide and N,N-dimethylaminopropyl acrylamide;

amino alkyl acrylates such as N,N-dimethylaminoethyl acrylate and N,N-dimethylaminopropyl acrylate;

polyvalent acrylates such as alkyldiols such as hexanediol, nonanediol and decanediol, polyvalent alcohols such as trimethylolpropane, pentaerythritol, dipentaerythritol, isocyanurate and tris-hydroxyethylisocyanurate or polyvalent acrylates such as ethylene oxide adducts, propylene oxide adducts or ε-caprolactone adducts of the polyvalent alcohol, for example, bifunctional acrylates such as 1,6-hexanediol diacrylate, 1,9-nonanediol diacrylate and 1,10-decanediol diacrylate, trifunctional acrylates such as trimethylolpropane triacrylate, pentaerythritol triacrylate, tris(2-hydroxyethyl) isocyanurate triacrylate, ethylene oxide-modified trimethylol triacrylate, ethylene oxide-modified trimethylolpropane triacrylate, propylene oxide-modified trimethylolpropane triacrylate and ε-caprolactone-modified tris-(2-acryloxyethyl) isocyanurate, tetrafunctional acrylates such as ditrimethylolpropane tetraacrylate, pentaerythritol tetraacrylate and ethoxylated pentaerythritol tetraacrylate, pentafunctional acrylates such as pentaacrylate of dipentaerythritol, hexafunctional acrylates such as dipentaerythritol hexaacrylate, phenoxy acrylates, bisphenol A diacrylates, and ethylene oxide adducts or propylene oxide adducts of these phenols; polyvalent acrylates of a glycidyl ether such as glycerin diglycidyl ether, glycerin triglycidyl ether, trimethylolpropane triglycidyl ether and triglycidyl isocyanurate; acrylates having a dicyclopentadiene skeleton such as dicyclopentadiene diacrylate; not limited to the above-described acrylates, acrylates obtained by directly forming an acrylate of a polyol such as polyether polyol, polycarbonate diol, hydroxyl group-terminated polybutadiene or polyester polyol or by forming an urethane acrylate through diisocyanate, melamine acrylate and individual methacrylates corresponding to the above-described acrylates.

Further examples thereof include epoxy (meth)acrylate resins obtained by reacting (meth)acrylic acid with a polyfunctional epoxy resin such as cresol novolac-type epoxy resin, and epoxy urethane acrylate compounds obtained by further reacting a hydroxy acrylate such as pentaerythritol triacrylate and a half urethane compound of a diisocyanate such as isophorone diisocyanate with a hydroxyl group of the epoxy acrylate resin. Such epoxy acrylate-based resins are capable of improving photocurability without extending the set-to-touch time.

The compound having an ethylenically unsaturated group (B) may be used singly or in combination of two or more.

The compound having an ethylenically unsaturated group (B) is added in a ratio of preferably 0.1 to 25 parts by mass and more preferably 3 to 20 parts by mass to 100 parts by mass of the solid content of the curable resin composition.

When the dosage of the compound having an ethylenically unsaturated group (B) is set to 0.1 parts by mass or more with respect to 100 parts by mass of the solid content of the curable resin composition, the curable resin composition has good photocurability, and when the amount is set to 20 parts by mass or less, halation attributed to excess photopolymerization reaction is prevented to provide good resolution.

(C) Photopolymerization Initiator

The curable resin composition of the present invention contains (C) a photopolymerization initiator. As the photopolymerization initiator (C), a known common material can be used with no particular limitations. Particularly, as described below, it is possible to use an oxime ester-based one having a structure represented by a general formula (I), an α-aminoacetophenone-based one having a structure represented by a general formula (II), an acylphosphine oxide-based one having a structure represented by a general formula (III), a titanocene-based one having a structure represented by a general formula (IV) and the like.

The photopolymerization initiator (C) may be used singly or in combination of two or more.

Oxime Ester-Based Photopolymerization Initiator

[Chem. 2]

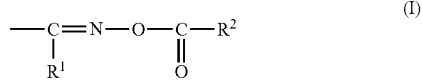

The oxime ester-based photopolymerization initiator is represented by the general formula (I), and, in the general formula (I), $R^1$ represent a hydrogen atom, a phenyl group, an alkyl group, a cycloalkyl group, an alkanoyl group or a benzoyl group. $R^2$ represents a phenyl group, an alkyl group, a cycloalkyl group, an alkanoyl group or a benzoyl group. The phenyl groups represented by $R^1$ and $R^2$ may have a substituent, and examples of the substituent include an alkyl group having 1 to 6 carbon atoms, a phenyl group, a halogen atom and the like. As the alkyl groups represented by $R^1$ and $R^2$, an alkyl group having 1 to 20 carbon atoms is preferable, and the alkyl group may include one or more oxygen atoms in an alkyl chain. In addition, the alkyl groups may include one or more hydroxyl groups as a substituent. As the cycloalkyl groups represented by $R^1$ and $R^2$, a cycloalkyl group having 5 to 8 carbon atoms is preferable. As the alkanoyl groups represented by $R^1$ and $R^2$, an alkanoyl group having 2 to 20 carbon atoms is preferable. The benzoyl groups represented by $R^1$ and $R^2$ may have a substituent, and examples of the substituent include an alkyl group having 1 to 6 carbon atoms, a phenyl group and the like.

Specific examples of the oxime ester-based photopolymerization initiator of the general formula (I) include 1,2-octanedione-1-[4-(phenylthio)-2-(O-benzoyloxime)], etanone, 1-[9-ethyl-6-(2-methylbenzoyl)-9H-carbazole-3-yl]-, 1-(O-acetyloxime) and the like. Examples of commercially available products include CGI-325, IRGACURE OXE01 and IRGACURE OXE02 manufactured by BASF Japan Ltd., N-1919 and NCI-831 manufactured by Adeka Corporation, and the like. Photopolymerization initiators having two oxime ester groups in the molecule or photopolymerization initiators having a carbazole structure can also be preferably used.

α-Aminoacetophenone-Based Photopolymerization Initiator

[Chem. 3]

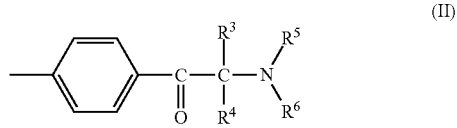

(II)

The α-aminoacetophenone-based photopolymerization initiator is represented by the general formula (II), in the general formula (II), $R^3$ and $R^4$ each independently represent an alkyl group or arylalkyl group having 1 to 12 carbon atoms, and $R^5$ and $R^6$ each independently represent a hydrogen atom or an alkyl group having 1 to 6 carbon atoms or $R^5$ and $R^6$ may bond together to form a cyclic alkyl ether group.

As a specific example of the α-aminoacetophenone-based photopolymerization initiator, a commercially available compound such as (4-morpholinobenzoyl)-1-benzyl-1-dimethylaminopropane (OMNIRAD 369, trade name, manufactured by IGM Resins), 4-(methylthiobenzoyl)-1-methyl-1-morpholinoetane (OMNIRAD 907, trade name, manufactured by IGM Resins) or 2-(dimethylamino)-2-[(4-methylphenyl) methyl]-1-[4-(4-morpholinyl) phenyl]-1-butanone (OMNIRAD 379, trade name, manufactured by IGM Resins) or a solution thereof can be used.

Acylphosphine Oxide-Based Photopolymerization Initiator

[Chem. 4]

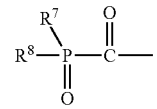

(III)

The acylphosphine oxide-based photopolymerization initiator is represented by the general formula (III), in the general formula (III), $R^7$ and $R^8$ each independently represent an alkyl group having 1 to 10 carbon atoms, a cycloalkyl group having 5 to 8 carbon atoms such as a cyclopentyl group or a cyclohexyl group, an aryl group, an aryl group including a halogen atom, an alkyl group or an alkoxy group as a substituent or a carbonyl group having 1 to 20 carbon atoms (here, a case where both are carbonyl groups having 1 to 20 carbon atoms is excluded).

Specific examples of the acylphosphine oxide-based photopolymerization initiator include 2,4,6-trimethylbenzoyldiphenylphosphine oxide, bis(2,4,6-trimethylbenzoyl)-phenylphosphine oxide, bis(2,6-dimethoxybenzoyl)-2,4,4-trimethyl-pentylphosphine oxide and the like. Examples of commercially available products include OMNIRAD TPO manufactured by IGM Resins, OMNIRAD 819 manufactured by IGM Resins and the like.

Titanocene-Based Photopolymerization Initiator

[Chem. 5]

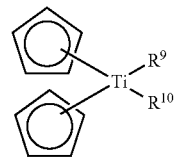

(IV)

The titanocene-based photopolymerization initiator is represented by the general formula (IV), and, in the general formula (IV), $R^9$ and $R^{10}$ each independently represent a halogen atom, an aryl group, an aryl halide group or a hetero ring-containing aryl halide group.

Examples of the titanocene-based photopolymerization initiator include bis(η5-2,4-cyclopentadiene-1-yl)-bis(2,6-difluoro-3-(1H-pyrrole-1-yl)-phenyl) titanium. Examples of commercially available products include IRGACURE 784 manufactured by BASF Japan Ltd. and the like.

In the present specification, a halogen or a halogen atom means fluorine, chlorine, bromine and iodine, and an aryl means a monocyclic aromatic hydrocarbon such as a phenyl group and a polycyclic aromatic hydrocarbon group such as a naphthyl group.

Examples of other photopolymerization initiators that are used in the present invention include benzoin and benzoin alkyl ethers such as benzoin, benzoin methyl ether, benzoin ethyl ether and benzoin isopropyl ether; anthraquinones such as 2-methylanthraquinone, 2-ethylanthraquinone, 2-t-butylanthraquinone, 1-chloroanthraquinone and 2-amylanthraquinone; thioxanthones such as 2,4-dimethylthioxanthone, 2,4-diethylthioxanthone, 2-chlorothioxanthone and 2,4-diisopropylthioxanthone; ketals such as acetophenone dimethyl ketal and benzyl dimethyl ketal; benzophenones such as benzophenone; xanthones; a variety of peroxides such as 3,3'4,4'-tetra-(tert-butylperoxycarbonyl)benzophenone; 1,7-bis(9-acrydinyl)heptane and the like.

In the curable resin composition of the present invention, it is possible to use one or more known common photosensitizers such as tertiary amines such as N,N-dimethylaminobenzoic acid ethyl ester, N,N-dimethylaminobenzoic acid isoamyl ester, pentyl-4-dimethylaminobenzoate, triethylamine and triethanolamine in combination with the above-described photopolymerization initiator. Furthermore, in a case where a deeper case depth by photocuring is required, 3-substituted coumarin dye, a leuco dye or the like can be used in combination as a curing aid as necessary.

The photopolymerization initiator (C) is added in a ratio of ordinarily 0.1 to 50 parts by mass and more preferably 1 to 30 parts by mass to 100 parts by mass of the solid content of the curable resin composition. When the dosage of the photopolymerization initiator (C) is within the above-described range with respect to 100 parts by mass of the solid content of the curable resin composition, a photocuring reaction is well promoted.

(D) Thermosetting Resin

The curable resin composition of the present invention may further contain (D) a thermosetting resin. Examples of the thermosetting resin (D) include known thermosetting resins such as compounds having two or more cyclic ether groups and/or cyclic thioether groups in the molecule such as polyfunctional epoxy compounds, polyfunctional oxetane compounds and episulfide resins, compounds having two or more isocyanate groups or blocked isocyanate groups in one molecule such as polyisocyanate compounds and blocked isocyanate compounds, amine resins such as melamine resins and benzoguanamine resins and derivatives thereof, bismaleimide, oxazine, cyclocarbonate compounds and carbodiimide resins.

As the polyfunctional epoxy resin, a known common polyfunctional epoxy resin having at least two epoxy groups in one molecule can be used. The epoxy resin may have a liquid form or may have a solid form or a semisolid form. Examples of the polyfunctional epoxy resin include a bisphenol A-type epoxy resin; a brominated epoxy resin; a novolac-type epoxy resin; a bisphenol F-type epoxy resin; a hydrogenated bisphenol A-type epoxy resin; a glycidylamine-type epoxy resin; a hydantoin-type epoxy resin; an alicyclic epoxy resin; a trihydroxyphenylmethan-type epoxy resin; a bixylenol-type or biphenol-type epoxy resin or a mixture thereof; a bisphenol S-type epoxy resin; a bisphenol A novolac-type epoxy resin; a tetraphenylol ethane-type epoxy resin; a heterocyclic epoxy resin; a diglycidyl phthalate resin; a tetraglycidyl xylenoylethane resin; a naphthalene group-containing epoxy resin; an epoxy resin having a dicyclopentadiene skeleton; a glycidyl methacrylate copolymerized epoxy resin; a copolymerized epoxy resin of cyclohexyl maleimide and glycidyl methacrylate; an epoxy-modified polybutadiene rubber derivative; and a CTBN-modified epoxy resin, but the polyfunctional epoxy resin is not limited thereto. As the epoxy resin, a bisphenol A-type or bisphenol F-type novolac-type epoxy resin, a bixylenol-type epoxy resin, a biphenol-type epoxy resin, a biphenol novolac-type (biphenyl aralkyl-type) epoxy resin, a naphthalene-type epoxy resin or a mixture thereof is preferable.

An epoxy resin having an aromatic ring skeleton (for example, a naphthalene skeleton) is preferable from the viewpoint of improving the heat resistance, and an epoxy resin having an alicyclic skeleton is preferable from the viewpoint of improving the resolution.

Examples of the epoxy resin having an aromatic ring skeleton include an epoxy resin having a naphthalene skeleton, particularly, an aralkyl-type naphthalene. In this epoxy resin having a naphthalene skeleton, naphthalene has a planar structure, and it is possible to further improve the heat resistance by decreasing the linear expansion coefficient. Examples of a commercially available product of this epoxy resin having a naphthalene skeleton include ESN-190 and ESN-360 manufactured by Nippon Steel Chemical & Material Co., Ltd., EPICLON HP-4032 and EPICLON HP-4032D manufactured by DIC Corporation and NC-7000L manufactured by Nippon Kayaku Co., Ltd. Furthermore, examples of an epoxy resin having an alicyclic skeleton include an epoxy resin having a dicyclopentadiene skeleton. From this epoxy resin having an alicyclic skeleton, a glass transition temperature improvement effect can be expected more than from an epoxy resin having a chain-like skeleton.

The thermosetting resin as described above may be used singly or two or more thermosetting resins may be used in combination.

In a case where the thermosetting resin (D) is used, in the curable resin composition of the present invention capable of achieving the above-described first objective, when the dosage is set to 5 to 20 parts by mass with respect to 100 parts by mass of the solid content of the curable resin composition, both the developability of the curable resin composition and the heat resistance and resolution of cured products become extremely excellent.

In addition, regarding the dosage of the thermosetting resin (D) in the curable resin composition of the present invention capable of achieving the above-described second objective, the thermosetting resin (D) is used in a ratio of preferably 5 to 200 mass % and more preferably 10 to 150 mass % to the mass of the amide-imide resin (A) from the viewpoint of good hardness, heat resistance, electrical insulating properties and developability of cured products.

(E) Carboxyl Group-Containing Resin

In order to further improve the developability, the curable resin composition of the present invention may contain (E) a carboxyl group-containing resin depending on cases.

The carboxyl group-containing resin (E) is a compound having a different structure from the above-described amide-imide resin (A) and has no amide-imide structures, and a photosensitive or non-photosensitive resin having a carboxyl group in the molecule can be used. Specific examples thereof include the following (E1) to (E10).

Specific examples of a non-photosensitive carboxyl group-containing resin may include compounds as described below (that are either an oligomer or a polymer).

(E1) A carboxyl group-containing resin that is obtained by copolymerization of an unsaturated carboxylic acid such as (meth)acrylic acid and an unsaturated group-containing compound such as styrene, α-methylstyrene, lower alkyl (meth)acrylate and isobutylene.

(E2) A carboxyl group-containing urethane resin by a polyaddition reaction between a diisocyanate such as aliphatic diisocyanate, branched aliphatic diisocyanate, alicyclic diisocyanate and aromatic diisocyanate and a diol compound such as a carboxyl group-containing dialcohol compound including dimethylolpropionic acid and dimethylolbutanoic acid and a compound having a phenolic hydroxyl group and an alcoholic hydroxyl group including a polycarbonate-based polyol, a polyether-based polyol, a polyester-based polyol, a polyolefin-based polyol, an acrylic polyol and a bisphenol A-based alkylene oxide adduct diol.

(E3) A terminal carboxyl group-containing urethane resin formed by reacting an acid anhydride with a terminal of an urethane resin by a polyaddition reaction between a diisocyanate compound such as aliphatic diisocyanate, branched aliphatic diisocyanate, alicyclic diisocyanate and aromatic diisocyanate and a diol compound such as a compound having a phenolic hydroxyl group and an alcoholic hydroxyl group including a polycarbonate-based polyol, a polyether-based polyol, a polyester-based polyol, a polyolefin-based polyol, an acrylic polyol and a bisphenol A-based alkylene oxide adduct diol.

(E4) A carboxyl group-containing photosensitive urethane resin by a polyaddition reaction between a diisocyanate and a (meta)acrylate or partial acid anhydride modified product of a difunctional epoxy resin such as a bisphenol A-type epoxy resin, a hydrogenated bisphenol A-type epoxy resin, a bisphenol F-type epoxy resin, a bisphenol S-type epoxy resin, a bixylenol-type epoxy resin and a biphenol-type epoxy resin, a carboxyl group-containing dialcohol compound and a diol compound.

(E5) A carboxyl group-containing photosensitive urethane resin turned into a terminal-(meth)acrylate by adding a compound having one hydroxyl group and one or more (meth)acryloyl groups to the molecule of hydroxyalkyl (meth)acrylate or the like during the synthesis of the above-described resin (E2) or (E4).

(E6) A carboxyl group-containing photosensitive urethane resin turned into a terminal-(meth)acrylate by adding a compound having one isocyanate group and one or more (meth)acryloyl groups to the molecule of equimolar reaction product of isophorone diisocyanate and pentaerythritol triacrylate during the synthesis of the above-described resin (E2) or (E4).

(E7) A carboxyl group-containing photosensitive resin in which a dibasic acid anhydride such as phthalic anhydride, tetrahydrophthalic anhydride and hexahydrophthalic anhydride is added to a hydroxyl group present in a side chain by reacting (meth)acrylic acid with a polyfunctional (difunctional or higher-functional) epoxy resin as described below. Here, the epoxy resin preferably has a solid form.

(E8) A carboxyl group-containing photosensitive resin in which (meth)acrylic acid is reacted with a polyfunctional epoxy resin in which a hydroxyl group of a difunctional epoxy resin as described below is further epoxidized with epichlorohydrin and a dibasic acid anhydride is added to the generated hydroxyl group. Here, the epoxy resin preferably has a solid form.

(E9) A carboxyl group-containing photosensitive resin in which a cyclic ether such as ethylene oxide or a cyclic carbonate such as propylene carbonate is added to a polyfunctional phenol compound such as novolac, the obtained hydroxyl groups are partially esterified with (meth)acrylic acid, and a polybasic acid anhydride is reacted with the remaining hydroxyl groups.

(E10) A carboxyl group-containing photosensitive resin formed by further adding a compound having one epoxy group and one or more (meth)acryloyl groups in the molecule of glycidyl (meth)acrylate, α-methylglycidyl (meth)acrylate or the like to one of these resins (E1) to (E9).

(E11) A carboxyl group-containing photosensitive resin that is obtained by reacting an unsaturated group-containing monocarboxylic acid such as (meth)acrylate with a reaction product such as a polyalcohol resin that is obtained by reacting a compound having a plurality of phenolic hydroxy groups in one molecule, that is, a polyphenol compound (for example, phenol novolac or cresol novolac) with an alkylene oxide such as ethylene oxide and propylene oxide and further reacting a polybasic acid anhydride with a reaction product to be obtained.

(E12) A carboxyl group-containing photosensitive resin that is obtained by reacting an unsaturated group-containing monocarboxylic acid with a reaction product that is obtained by reacting a polyphenol compound (for example, phenol novolac or cresol novolac) and a cyclic carbonate compound such as ethylene carbonate and propylene carbonate and reacting a polybasic acid anhydride with a reaction product to be obtained.

In the present invention, a photosensitive carboxyl group-containing photosensitive resin having a polyphenol skeleton such as (E11) and (E12) described above is preferably used.

The carboxyl group-containing resin (E) may be used singly or in combination of two or more, and for the curable resin composition of the present invention capable of achieving the above-described first objective, the total mass of that resin is preferably 1 part by mass or more and 40 parts by mass or less with respect to 100 parts by mass of the solid content of the amide-imide resin (A), by which the developability of the curable resin composition and the resolution of cured products become good.

In a case where an inorganic filler is further contained in order to further improve the breaking strength of the cured coated films of the curable resin composition of the present invention, at the time of also improving the resolution together, 20 parts by mass to 200 parts by mass of the carboxyl group-containing resin can be contained with respect to 100 parts by mass of the amide-imide resin. In addition, in a case where the curable resin composition of the present invention capable of achieving the above-described second objective is used as a PID material for optical uses or as an optical sensor protective film, 50 parts by mass to 100 parts by mass of the carboxyl group-containing resin is more preferably contained with respect to 100 parts by mass of the amide-imide resin from the viewpoint of the balance among individual characteristics.

Inorganic Filler

In the curable resin composition of the present invention, an inorganic filler that is used in normal resin compositions can be further contained.

Specific examples thereof include non-metallic fillers such as silica, barium sulfate, calcium carbonate, silicon nitride, aluminum nitride, boron nitride, alumina, magnesium oxide, aluminum hydroxide, magnesium hydroxide, titanium oxide, mica, talc, Neuburg silica soil and organic bentonite and metal fillers such as copper, gold, silver, palladium and silicon.

In the curable resin composition of the present invention, these inorganic fillers may be used singly or in combination of two or more. In the present invention, barium sulfate, silica or both are preferably used.

The content of the inorganic filler is 5 to 60 mass % and preferably set to 10 to 50 mass % with respect to the total mass of the solid content of the curable resin composition of the present invention. When the dosage of the inorganic filler is appropriately selected depending on the type of the inorganic filler, it is possible to improve the strength without degrading the resolution of cured coated films.

Other Components

To the curable resin composition of the present invention, components other than the above-described components can be added as long as the effect of the present invention is not impaired. As additives, a silicone-based or fluorine-based defoamer, a leveling agent, a thermal polymerization inhibitor, an ultraviolet absorber, a solvent, a silane coupling agent, a plasticizer, a foaming agent, a flame retardant, an antistatic agent, an anti-aging agent, an antibacterial and antifungal agent and the like can be blended.

In order to obtain an appropriate viscosity for applying the curable resin composition to substrates or carrier films, a solvent can be used. As such a solvent, an organic solvent is mainly used, and specific examples thereof include ketones, aromatic hydrocarbons, glycol ethers, glycol ether acetates, esters, alcohols, aliphatic hydrocarbons, and petroleum-based solvents. More specific examples thereof include ketones such as methyl ethyl ketone and cyclohexanone; aromatic hydrocarbons such as toluene, xylene and tetramethylbenzene; glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether and triethylene glycol monoethyl ether; esters such as ethyl acetate, butyl acetate, dipropylene glycol methyl ether acetate, propylene glycol methyl ether acetate, propylene glycol ethyl ether acetate and propylene glycol butyl ether acetate; alcohols such as ethanol, propanol, ethylene glycol and propylene glycol; aliphatic hydrocarbons such as octane and decane; and petroleum-based solvents such as petroleum ether, petroleum naphtha, hydrogenated petroleum naphtha and solvent naphtha. One type of such an organic solvent may be used singly or two or more types thereof may be used in combination.

The curable resin composition of the present invention may have a liquid form or may have a dry film form that is obtained by drying a liquid-form resin composition. The liquid-form resin composition may be a two-component liquid form or the like from the viewpoint of storage stability, but may be a one-component liquid form. Hereinafter, a dry film will be described in detail as one use aspect of the curable resin composition.

Production of Dry Film

A dry film of the present invention has a resin layer obtained by applying the curable resin composition of the present invention onto a film (hereinafter, also referred to as "carrier film") and then drying the curable resin composition. The dry film of the present invention can be obtained by diluting the curable resin composition of the present invention with an organic solvent to adjust the viscosity to an appropriate viscosity, applying the curable resin composition on the carrier film in a uniform thickness with a comma coater, a blade coater, a lip coater, a rod coater, a squeeze coater, a reverse coater, a transfer roll coater, a gravure coater, a spray coater or the like and drying the curable resin composition, usually, at a temperature of 50° C. to 130° C. for one to 30 minutes. The coated film thickness is not particularly limited; however, generally, the coated film thickness needs to be appropriately set in a range of 3 to 100 μm, preferably 5 to 40 μm, in terms of the dried film thickness.

As the carrier film, a plastic film can be preferably used, and a plastic film such as a polyester film including polyethylene terephthalate, a polyimide film, a polyamide-imide film, a polypropylene film or a polystyrene film is preferably used. The thickness of the carrier film is not particularly limited, but is, ordinary, appropriately selected within a range of 10 to 150 μm.

After the curable resin composition of the present invention is applied to and dried on the carrier film, a peelable film (hereinafter, also referred to as "cover film") may be further laminated on the surface of the coated film for the purpose of preventing the attachment of dust to the surface of the coated film or the like. As the peelable cover film, for example, a polyethylene film, a polytetrafluoroethylene film, a polypropylene film, surface-treated paper or the like can be used, and in peeling off the cover film, the adhesive force between the coated film and the cover film needs to be weaker than the adhesive force between the coated film and the carrier film.

A drying treatment that is performed after the application of the curable resin composition of the present invention onto the carrier film is performed using a hot air circulation-type drying furnace, an IR furnace, a hot plate, a convection oven or the like, whereby the dry film is obtained.

In the case of directly applying the curable resin composition onto a substrate, as a base material, in addition to a printed wiring board on which a circuit has been formed in advance or a flexible printed wiring board, copper-clad laminates of all grades (FR-4 and the like) for which a material of a copper-clad laminate for a high-frequency circuit, for which paper phenol, paper epoxy, glass fabric epoxy, glass polyimide, glass fabric/non-woven fabric epoxy, glass fabric/paper epoxy, synthetic fiber epoxy, fluorine/polyethylene/polyphenylene ether, polyphenylene oxide/cyanate ester or the like is used or the like is used, additionally, a polyimide film, a PET film, a glass substrate, a ceramic substrate, a wafer plate and the like can be exemplified.

Production of Cured Product

A cured product (cured film) for which the curable resin composition of the present invention is used is produced as described below. That is, first, the curable resin composition is diluted with a solvent as necessary and then applied onto a substrate. A pattern is formed on the curable resin composition by selectively exposing a resin layer obtained after the solvent is volatilized to dry the curable resin composition (irradiating the resin layer with light) and curing a light-exposed portion (a portion irradiated with light). After that, a non-light-exposed portion is developed with an alkaline aqueous solution (for example, a 0.3 to 3 mass % sodium carbonate aqueous solution), thereby forming a pattern of a coated film. Furthermore, the curable resin composition is irradiated with light to perform photocuring coating, thereby forming a cured coated film.

As a coating method, an arbitrary method such as a dip coating method, a flow coating method, a bar coating method and a screen printing method can be applied. In addition, as an irradiation light source of active energy rays, a low-pressure mercury lamp, a medium-pressure mercury lamp, a high-pressure mercury lamp, an ultrahigh-pressure mercury lamp, a xenon lamp, a metal halide lamp and the like are appropriate. Additionally, an UV-LED, laser light rays, electron beams and the like can also be used as the active energy rays.

The volatilization and drying of the solvent, which are performed after the application of the curable resin composition, can be performed using a hot air circulation-type drying furnace, an IR furnace, a hot plate, a convection oven or the like (a method in which a hot air in a dryer is counter-currently brought into contact using a device including a heat source in which an air is heated by steam and a method in which the air is blown to a support from a nozzle).

The dried curable resin composition or the dry film can be exposed to the active energy rays by a contact-type method or a non-contact-type method through a photomask in which a pattern has been formed. Additionally, a pattern is directly light-exposed on the curable resin composition or the dry film with a laser direct stepper, which makes it possible for a light-exposed portion to be photocured.

Here, the stepper that is used for the irradiation with the active energy rays needs to be a device that is equipped with a high-pressure mercury lamp, an ultrahigh-pressure mercury lamp, a metal halide lamp, a mercury short arc lamp or the like and is capable of radiating ultraviolet rays within a range of 350 nm to 450 nm, and, furthermore, a direct drawing device such as a direct imaging device configured to directly draw images with active energy rays based on CAD data from a computer can also be used. A light source in the direct drawing device may be any of a gas laser and a solid laser as long as a mercury short arc lamp, an LED and laser light having the maximum wavelength within a range of 350 nm to 410 nm are used. The light exposure for forming an image on the patterned resin layer differs depending on the film thickness or the like, but can be set within a range of ordinarily 20 to 1,500 mJ/cm$^2$ and preferably 20 to 1,200 mJ/cm$^2$.

As a developing method, a dipping method, a shower method, a spray method, a brush method or the like can be adopted, and, as a developer, an alkaline aqueous solution such as potassium hydroxide, sodium hydroxide, sodium carbonate, potassium carbonate, sodium phosphate, sodium silicate, ammonia or amines can be used.

Furthermore, the curable resin composition of the present invention can be photocured by being irradiated with active energy rays within a range of, for example, 50 mJ/cm$^2$ to 1500 mJ/cm$^2$. The light irradiation is performed by irradiation with active energy rays such as ultraviolet rays, electron beams or chemical beams and preferably performed by irradiation with ultraviolet rays. In a case where the curable resin composition contains a thermosetting component, after the photocuring, the curable resin composition is thermally cured (post curing) by being heated to a temperature of approximately 100° C. to 180° C., which promotes the curing of the coated film.

The curable resin composition of the present invention can be applied to electronic components. An electronic component of the present invention means a component that is used in electronic circuits, includes not only an active component such as a printed wiring board, a light-emitting diode and a laser diode but also a passive component such as a resistance, a capacitor, an inductor and a connector, and is a component where the cured coated film of the curable composition of the present invention exhibits the effect of the present invention. The curable resin composition of the present invention is preferable for forming, particularly, insulating cured films in printed wiring boards and more preferable for forming permanent insulating films for coverlays, solder masks, interlayer insulating materials, insulating materials for forming rewiring layers and the like.

Electronic components including the cured product obtained from the curable resin composition of the present invention are capable of sufficiently exhibiting functions as electronic components since the resolution and heat resistance of the cured product are excellent. In addition, the cured product obtained from the curable resin composition of the present invention is also excellent in chemical resistance, and therefore when it is washed with an acid or an alkali during the production of boards or washed with a solvent during mounting, the cured product does not cause degradation, deformation and the like due to the chemical to be used and is capable of maintaining and improving the accuracy of electronic components.

EXAMPLES

Hereinafter, the present invention will be described in more detail using Examples and Comparative Examples. The present invention is not limited to the following Examples, and "parts" and "%" in the following description are all mass-based unless particularly otherwise described.

[Synthesis of Raw Materials]
[Production of Amide-Imide Resin]

Synthesis Example 1: Synthesis of (A) Amide-Imide Resin 1

Diethylene glycol monoethyl ether acetate (EDGA) (5184 g), IPDI3N (isocyanurate-type triisocyanate synthesized from isophorone diisocyanate: NCO %=18.2) (2070 g, 3 mol) and cyclohexane-1,3,4-tricarboxylic acid-3,4-anhydride (1782 g, 9 mol) were added to a flask equipped with a stirring device, a thermometer and a condenser and heated up to 140° C. A reaction proceeded together with foaming. The components were reacted at this temperature for eight hours. The inside of the system turned into a light yellow liquid, as a result of measuring characteristic absorption in an infrared spectrum, 2270 cm$^{-1}$, which is the characteristic absorption of an isocyanate group, completely disappeared, and absorption of an imide group was confirmed at 1780 cm$^{-1}$ and 1720 cm$^{-1}$. The acid value was 140 KOHmg/g in terms of the solid content, and the molecular weight was a number-average molecular weight of 800 in terms of polystyrene. In addition, the concentration of a resin component was 40 mass %. A solution of this resin is regarded as a solution of (A) an amide-imide resin 1.

Synthesis Example 2: Synthesis of (A') Amide-Imide Resin 2

Diethylene glycol monoethyl ether acetate (EDGA) (4628 g), IPDI3N (isocyanurate-type triisocyanate synthesized from isophorone diisocyanate: NCO %=18.2) (2070 g, 3 mol) and cyclohexane-1,3,4-tricarboxylic acid-3,4-anhydride (1386 g, 7 mol) were added to a flask equipped with a stirring device, a thermometer and a condenser and heated up to 140° C. A reaction proceeded together with foaming. The components were reacted at this temperature for eight hours. The inside of the system turned into a light yellow liquid, and, as a result of measuring characteristic absorption in an infrared spectrum, 2270 cm$^{-1}$, which is the characteristic absorption of an isocyanate group, completely disappeared, and absorption of an imide group was confirmed at 1780 cm$^{-1}$ and 1720 cm$^{-1}$. The acid value was 140 KOHmg/g in terms of the solid content, and the molecular weight was a number-average molecular weight of 5800 in terms of polystyrene. In addition, the concentration of a resin component was 40 mass %. A solution of this resin is regarded as a solution of (A') an amide-imide resin 2.

Synthesis Example 3: Synthesis of (A') Amide-Imide Resin 3

Diethylene glycol monoethyl ether acetate (EDGA) (4903 g), IPDI3N (isocyanurate-type triisocyanate synthesized from isophorone diisocyanate: NCO %=18.2) (2070 g, 3 mol) and cyclohexane-1,3,4-tricarboxylic acid-3,4-anhydride (1683 g, 8.5 mol) were added to a flask equipped with a stirring device, a thermometer and a condenser and heated up to 140° C. A reaction proceeded together with foaming. The components were reacted at this temperature for eight hours. The inside of the system turned into a light yellow liquid, and, as a result of measuring characteristic absorption in an infrared spectrum, 2270 $cm^{-1}$, which is the characteristic absorption of an isocyanate group, completely disappeared, and absorption of an imide group was confirmed at 1780 $cm^{-1}$ and 1720 $cm^{-1}$. The acid value was 140 KOHmg/g in terms of the solid content, and the molecular weight was a number-average molecular weight of 1500 in terms of polystyrene. In addition, the concentration of a resin component was 40 mass %. A solution of this resin is regarded as a solution of (A') an amide-imide resin 3.

Synthesis Example 4: Synthesis of (A) Amide-Imide Resin 4

Diethylene glycol monoethyl ether acetate (EDGA) (3554 g), IPDI3N (isocyanurate-type triisocyanate synthesized from isophorone diisocyanate: NCO %=18.2) (2070 g, 3 mol) and 1,2,4-benzenetricarboxylic acid 1,2-anhydride (1333 g, 9 mol) were added to a flask equipped with a stirring device, a thermometer and a condenser and heated up to 140° C. A reaction proceeded together with foaming. The components were reacted at this temperature for eight hours. The inside of the system turned into a brown liquid, as a result of measuring characteristic absorption in an infrared spectrum, 2270 $cm^{-1}$, which is the characteristic absorption of an isocyanate group, completely disappeared, and absorption of an imide group was confirmed at 1780 $cm^{-1}$ and 1720 $cm^{-1}$. The acid value was 140 KOHmg/g in terms of the solid content, and the molecular weight was a number-average molecular weight of 800 in terms of polystyrene. In addition, the concentration of a resin component was 40 mass %.

A solution of this resin is regarded as a solution of (A) an amide-imide resin 4.

The number-average molecular weights of the amide-imide resins 1 to 4 were measured by the gel permeation chromatography (GPC) (polystyrene standard) with the following measuring instrument under the following measurement conditions.

Instrument name: Manufactured by Waters Corporation, Waters 2695
Detector: Manufactured by Waters Corporation, 2414 differential refractive index (RI) detector
Column: Manufactured by Waters Corporation, HSPgel column for high-speed analysis, HRMB-L,
3 µm, 6 mm×150 mm×2, and
manufactured by Waters Corporation, HSPgel column, HR 1.3 µm,
6 mm×150 mm×2
Measurement conditions:
Column temperature: 40° C.
Set temperature of RI detector: 35° C.
Developing solvent: Tetrahydrofuran
Flow rate: 0.5 ml/minute
Amount of sample: 10 µl
Concentration of sample: 0.5 wt %

Synthesis Example 5: Synthesis of Carboxyl Group-Containing Resin

A novolac-type cresol resin (manufactured by Showa Denko K.K., trade name "SHONOL CRG951", OH equivalent: 119.4) (119.4 g), potassium hydroxide (1.19 g) and toluene (119.4 g) were prepared in an autoclave including a thermometer, a nitrogen introduction and alkylene oxide introduction device and a stirring device, the inside of the system was substituted with nitrogen under stirring, and the temperature was raised by heating. Next, propylene oxide (63.8 g) was gradually added dropwise and reacted at 125° C. to 132° C. at 0 to 4.8 kg/cm2 for 16 hours. After that, the components were cooled to room temperature, 89% phosphoric acid (1.56 g) was added to and mixed with this reaction solution to neutralize potassium hydroxide, and a propylene oxide reaction solution of the novolac-type cresol resin (non-volatile component: 62.1%, hydroxyl value: 182.2 g/eq.) was obtained. In this reaction solution, an average of 1.08 mole of alkylene oxide was added per equivalent of a phenolic hydroxyl group. The obtained propylene oxide reaction solution of the novolac-type cresol resin (293.0 g), acrylic acid (43.2 g), methanesulfonic acid (11.53 g), methylhydroquinone (0.18 g) and toluene (252.9 g) were prepared in a reactor including a stirrer, a thermometer and an air blowing pipe, an air was blown into the reactor at a rate of 10 ml/minute and reacted at 110° C. for 12 hours under stirring. Water generated from the reaction was an azeotropic mixture with toluene, and water (12.6 g) was distilled. After that, the components were cooled to room temperature, and the obtained reaction solution was neutralized with a 15% sodium hydroxide aqueous solution (35.35 g) and then washed with water. After that, toluene was distilled while being substituted with diethylene glycol monoethyl ether acetate (118.1 g) with an evaporator, and a novolac-type acrylate resin solution was obtained. Next, the obtained novolac-type acrylate resin solution (332.5 g) and triphenylphosphine (1.22 g) were prepared in the reactor including a stirrer, a thermometer and an air blowing pipe, an air was blown into the reactor at a rate of 10 ml/minute, and tetrahydrophthalic anhydride (60.8 g) was gradually added under stirring and reacted at 95° C. to 101° C. for six hours. A carboxyl group-containing resin 1 having an acid value of a solid substance of 88 mgKOH/g and a solid content of 71% was obtained.

Examples 1 to 5 and Comparative Examples 1 to 3

Preparation of Curable Resin Compositions

Individual components as shown in Table 1 were blended, preliminarily mixed with a stirrer, kneaded and dispersed with a triple roll mill, thereby preparing curable resin compositions according to Examples 1 to 5 and Comparative Examples 1 to 3.

In the table, amounts blended indicate parts by mass (in terms of the solid content).

<Optimal Light Exposure>

A circuit pattern substrate having a copper thickness of 35 µm was polished with a buff roll, washed with water and dried. After that, each of the curable resin compositions of the Examples and the Comparative Examples was applied to the entire surface of the circuit pattern substrate by a screen printing method and dried for 60 minutes in a hot air circulation-type drying oven at 80° C. After the drying, the curable resin composition was light-exposed through a step tablet (Kodak No. 2) using a projection-type light exposure device equipped with a high-pressure mercury lamp, and the optimal light exposure was obtained when the pattern of the step tablet remaining after 60 seconds of development (30° C., 0.2 MPa, and 1 mass % sodium carbonate aqueous solution) was in the step 7.

<1. Resolution>

The curable resin composition was diluted to an appropriate viscosity with methyl ethyl ketone and applied onto a carrier film (polyethylene terephthalate film). This was heated and dried with a hot air dryer at 80° C. for 30 minutes to form a curable resin composition layer having a thickness of 20 µm, and a cover film (polypropylene film) was attached onto a coated film, thereby obtaining a dry film. After that, the cover film was peeled off, the obtained dry film was thermally laminated on a copper clad-laminated substrate and pattern-exposed at the optimal light exposure using the projection-type light exposure device equipped with a high-pressure mercury lamp, and development was performed for 250 seconds using a 1% $Na_2CO_3$ aqueous solution (30° C.) under the condition of a spray pressure of 0.2 MPa, thereby forming a via pattern. This substrate was irradiated with ultraviolet rays in a UV conveyor furnace under the condition of a cumulative light exposure of 1000 mJ/cm$^2$ and then heated at 180° C. for 60 minutes for curing.

The resolution of the substrate produced by an evaluation substrate production method as described above was observed using an electron microscope. The size of a via opening was confirmed and evaluated as described below.

⊚: A via pattern having φ of less than 20 µm was formed.
○: A via pattern had a shape with φ of 20 µm or more and less than 50 µm.
Δ: A via pattern had a shape with φ of 50 µm or more.
x: The shape of the opening could not be formed.

<2. Developability>

Each curable resin composition was diluted to an appropriate viscosity with methyl ethyl ketone and applied onto a carrier film (polyethylene terephthalate film). This was heated and dried with a hot air dryer at 80° C. for 30 minutes to form a curable resin composition layer having a thickness of 20 µm, and a cover film was attached onto the obtained coated film, thereby obtaining a dry film. After that, the cover film was peeled off, and the obtained dry film was thermally laminated on a copper clad-laminated substrate. The obtained substrate was developed with a 1% $Na_2CO_3$ aqueous solution (30° C.) under the condition of a spray pressure of 0.2 MPa for 60 seconds, and a development residue was evaluated as described below.

⊚: No residue
○: A residue with a film thickness of less than 1 µm
Δ: A residue with a film thickness of 1 µm or more and less than 3 µm
x: A residue with a film thickness of 3 µm or more <3. Heat Resistance>

Each curable resin composition was diluted to an appropriate viscosity with methyl ethyl ketone and applied onto a carrier film. This was heated and dried with a hot air dryer at 80° C. for 30 minutes to form a curable resin composition layer having a thickness of 20 µm, and a cover film was attached onto a coated film, thereby obtaining a dry film. After that, the cover film was peeled off and thermally laminated on a copper foil, solid light exposure was performed at the optimal light exposure using the projection-type light exposure device equipped with a high-pressure mercury lamp, and development was performed for 250 seconds using a 1% $Na_2CO_3$ aqueous solution (30° C.) under the condition of a spray pressure of 0.2 MPa. This substrate was irradiated with ultraviolet rays in a UV conveyor furnace under the condition of a cumulative light exposure of 1000 mJ/cm$^2$ and then heated at 180° C. for 60 minutes for curing. The cured coated film was peeled off from the resulting copper foil with the cured coated film attached thereto to obtain a film with the cured coated film.

The glass transition temperature of the obtained cured coated film was measured under the following conditions.

Instrument: Dynamic viscoelasticity measuring instrument (DMA6100 manufactured by Seiko Instruments Inc.)
Measurement temperature: 30° C. to 300° C. (5° C./min)
Frequency: 1 Hz
Glass transition temperature: The maximum value of measured tan δ is regarded as the glass transition temperature.

As the glass transition temperature increases, elastic changes occur at high temperatures, and thus the heat resistance is determined as more favorable.

Evaluation standards are as described below.

⊚: 190° C. or higher
○: 180° C. or higher
Δ: 170° C. or higher
x: Lower than 170° C.

<4. Breaking Strength>

For the evaluation substrate used for the evaluation of the heat resistance, the breaking strength was measured and evaluated based on JIS K 7127. Evaluation standards are as described below.

⊚: 80 MPa or more
○: 40 MPa or more and less than 80 MPa
x: Less than 40 MPa

<5. Chemical Resistance>

Each curable resin composition was diluted to an appropriate viscosity with methyl ethyl ketone, applied onto a silicon wafer using a spin coater, and heated and dried in a hot air dryer at 80° C. for 30 minutes, thereby obtaining a curable resin composition layer having a thickness of 20 µm. Solid light exposure was performed at the optimal light exposure using the projection-type light exposure device equipped with a high-pressure mercury lamp, and development was performed for 250 seconds using a 1% $Na_2CO_3$ aqueous solution (30° C.) under the condition of a spray pressure of 0.2 MPa.

This substrate was irradiated with ultraviolet rays in a UV conveyor furnace under the condition of a cumulative light exposure of 1000 mJ/cm$^2$ and then heated at 180° C. for 60 minutes for curing. The obtained curable resin composition layer on the wafer was cross-cut using a cutter so as to form 100 quadrangular squares (1 mm×1 mm). A 10% potassium hydroxide solution was warmed to 40° C. in a water bath, the cross-cut resin layer-attached wafer was immersed therein for 30 minutes, then, Sellotape (registered trademark) was attached to the water-washed and dried resin layer, and the chemical resistance was evaluated by peeling. Evaluation standards are as described below.

○: No peeling
Δ: The resin layer was slightly peeled off from the wafer along the cross-cut lines.
x: One or more cross-cut quadrangular squares were peeled off.

TABLE 1

Table 1. Compositions and test results of curable resin compositions (1)

| In term of solid content | Example 1 | Example 2 | Example 3 | Example 4 | Example 5 | Comparative Example 1 | Comparative Example 2 | Comparative Example 3 |
|---|---|---|---|---|---|---|---|---|
| (A) Amide-imide resin 1 | 100 | 80 | 80 | 80 | | | | |
| (A') Amide-imide resin 2 | | | | | | 100 | 20 | |
| (A') Amide-imide resin 3 | | | | | | | | 100 |
| (A) Amide-imide resin 4 | | | | | 100 | | | |
| (B) Resin having ethylenic double bond 1 | 20 | 10 | 5 | 5 | 20 | 20 | 10 | 20 |
| (B) Resin having ethylenic double bond 2 | 5 | 10 | 15 | 15 | 5 | 5 | 10 | 5 |
| (C) Photopolymerization initiator | 5 | 5 | 5 | 5 | 5 | 5 | 5 | 5 |
| (D) Thermosetting resin | | | 20 | 20 | | | | |
| (E) Carboxyl group-containing resin 1 | | 20 | 20 | 20 | | | 80 | |
| Inorganic particles 1 | | | | 20 | | | | |
| Inorganic particles 2 | | | | 20 | | | | |
| 1. Resolution | ◎ | ◎ | ◎ | ○ | ○ | X | Δ | Δ |
| 2. Developability | ○ | ◎ | ◎ | ◎ | ○ | X | X | X |
| 3. Heat resistance | ○ | ○ | ◎ | ◎ | ○ | ○ | X | ○ |
| 4. Breaking strength | ○ | ○ | ○ | ◎ | ○ | ○ | ○ | ○ |
| 5. Chemical resistance | ○ | ○ | ○ | ○ | ○ | ○ | X | ○ |

* Dosages in the table are based on parts by mass.

The details of the materials shown in the table will be described below.

(A) Amide-imide resin 1: Synthesized in Synthesis Example 1, Mn=800

(A') Amide-imide resin 2: Synthesized in Synthesis Example 2, Mn=5800

(A') Amide-imide resin 3: Synthesized in Synthesis Example 3, Mn=1500

(A) Amide-imide resin 4: Synthesized in Synthesis Example 4, Mn=800

(B) Resin having ethylenic double bond 1: Dipentaerythritol hexaacrylate (B) Resin having ethylenic double bond 2: Ethylene oxide-modified trimethylolpropane triacrylate (C) Photopolymerization initiator 1: 2-Methyl-1-(4-methylphenyl)-2-morpholinopropane-1-one (D) Thermosetting resin: Naphthol-modified epoxy resin NC-7000L (manufactured by Nippon Kayaku Co., Ltd.)

(E) Carboxyl group-containing resin: Synthesis Example 5

Inorganic particles 1: Barium sulfate

Inorganic particles 2: silica

From the test results, it is found that the curable resin composition of the present invention is not only excellent in heat resistance, but the resolution, the developability, the breaking strength and the chemical resistance also have improved.

The present invention is not limited to the constitution of the above-described embodiment and Examples, but can be modified in a variety of manners within the range of the gist of the invention.

Synthesis Example 6

An orthocresol novolac-type epoxy resin [EPICLON N-695 manufactured by DIC Corporation, softening point: 95° C., epoxy equivalent: 214, average number of functional groups: 7.6] (1070 g, number of glycidyl groups (total number of aromatic rings): 5.0 mol), acrylic acid (360 g, 5.0 mol) and hydroquinone (1.5 g) were charged into diethylene glycol monoethyl ether acetate (600 g), heated and stirred at 100° C., and uniformly dissolved. Next, triphenylphosphine (4.3 g) was charged, heated to 110° C. to be reacted for two hours and then heated to 120° C. to be further reacted for 12 hours. An aromatic hydrocarbon (SOLVESSO 150) (415 g) and methyl-5-norbornene-2,3-dicarboxylic anhydride (534 g, 3.0 mol) were charged into the obtained reaction solution, a reaction was performed at 110° C. for four hours, the reaction solution was cooled, and then a cresol novolac-type carboxyl group-containing resin solution having a solid content acid value of 89 mgKOH/g and a solid content of 65% was obtained.

The obtained resin is regarded as a carboxyl group-containing resin 2.

Examples 6 to 11 and Comparative Examples 4 to 7

Individual components were dosed based on component compositions shown in Table 2, preliminarily mixed with a stirrer, kneaded and dispersed with a triple roll mill, thereby preparing curable resin compositions according to Examples 6 to 11 and Comparative Examples 4 to 7. Dosages in the table indicate parts by mass (in terms of solid content).

<Method and Conditions for Measuring Number-Average Molecular Weight>

The number-average molecular weights of the amide-imide resins were measured by the gel permeation chromatography (GPC) (polystyrene standard) with the following measuring instrument under the following measurement conditions.

Instrument name: "Waters 2695" manufactured by Waters Corporation

Detector: "Waters 2414" manufactured by Waters Corporation, differential refractive index detector (RI)

Columns: Two "HSPgel Columns, HR MB-L, 3 μm, 6 mm×150 mm" manufactured by Waters Corporation and two "HSPgel Columns, HR 1, 3 μm, 6 mm×150 mm" manufactured by Waters Corporation Measurement conditions:

Column temperature: 40° C.

Set temperature of RI detector: 35° C.

Developing solvent: Tetrahydrofuran

Flow rate: 0.5 ml/minute

Amount of sample: 10 μl
Concentration of sample: 0.5 wt %

<Method for Manufacturing Evaluation Substrate>

Each curable resin composition produced was diluted to an appropriate viscosity with methyl ethyl ketone and applied onto a carrier film. This was heated and dried in a hot air dryer at 80° C. for 30 minutes to form a photosensitive resin composition layer having a thickness of 20 μm. Furthermore, a cover film was attached onto the obtained coated film to obtain a dry film. After that, the cover film was peeled off, the obtained dry film was thermally laminated on a copper foil substrate or a glass substrate, exposed at the optimal light exposure using a projection-type light exposure device equipped with a high-pressure mercury lamp (manufactured by Ushio, Inc.), and developed for 250 seconds using a 1% $Na_2CO_3$ aqueous solution (30° C.) under the condition of a spray pressure of 0.2 MPa, thereby obtaining a resist pattern. This substrate was irradiated with ultraviolet rays in a UV conveyor furnace under the condition of a cumulative light exposure of 1000 $mJ/cm^2$ and then heated at 180° C. for 60 minutes for curing, thereby producing an evaluation substrate. Characteristics were evaluated as described below from the obtained printed substrate (evaluation substrate).

<Optimal Light Exposure>

A dry film obtained in the same manner as the above-described method for manufacturing the evaluation substrate was laminated on a copper clad-laminated substrate and exposed through a photomask (manufactured by Stouffer Industries, Inc., step tablet No. 41) using a high-pressure mercury lamp exposure device. The irradiated dry film was used as a test piece and developed with a developer (sodium carbonate aqueous solution) with a spray pressure of 2 kg/cm² for 250 seconds, and the step number of a residual coated film was visually determined. A light exposure at which the step number of the residual coated film became eight was regarded as the optimal light exposure.

<Resolution>

Each curable resin composition was diluted to an appropriate viscosity with methyl ethyl ketone and applied onto a carrier film. This was heated and dried with a hot air dryer at 80° C. for 30 minutes to form a curable resin composition layer having a thickness of 20 μm, and a cover film was attached onto a coated film, thereby obtaining a dry film. After that, the cover film was peeled off, the obtained dry film was thermally laminated on a copper clad-laminated substrate, pattern light exposure was performed at the optimal light exposure using the projection-type light exposure device equipped with a high-pressure mercury lamp (manufactured by Ushio, Inc.), and development was performed for 250 seconds using a 1% $Na_2CO_3$ aqueous solution (30° C.) under the condition of a spray pressure of 0.2 MPa, thereby forming a via pattern. This substrate was irradiated with ultraviolet rays in a UV conveyor furnace under the condition of a cumulative light exposure of 1000 $mJ/cm^2$ and then heated at 180° C. for 60 minutes for curing.

The resolution of the substrate produced as described above was observed using an electron microscope. The size of a via opening was confirmed and evaluated as described below. The results are shown in Table 2.

⦾: A via pattern having φ of less than 20 um was formed.
○: A via pattern had a shape with φ of 20 um or more and less than 50 um.
Δ: A via pattern had a shape with φ of 50 um or more.
x: The shape of the opening could not be formed.

<Developability>

Each curable resin composition was diluted to an appropriate viscosity with methyl ethyl ketone and applied onto a carrier film. This was heated and dried with a hot air dryer at 80° C. for 30 minutes to form a curable resin composition layer having a thickness of 20 μm, and a cover film was attached onto the obtained coated film, thereby obtaining a dry film. After that, the cover film was peeled off, and the obtained dry film was thermally laminated on a copper clad-laminated substrate. The obtained substrate was developed using a 1% $Na_2CO_3$ aqueous solution (30° C.) under the conditions of a spray pressure of 0.2 MPa for 60 seconds, and a development residue was evaluated as described below. The results are shown in Table 2.

⦾: No residue
○: A residue with a film thickness of less than 1 um
Δ: A residue with a film thickness of 1 um or more and less than 3 um
x: A residue with a film thickness of 3 um or more <Heat resistance>

Each curable resin composition was diluted to an appropriate viscosity with methyl ethyl ketone and applied onto a carrier film. This was heated and dried with a hot air dryer at 80° C. for 30 minutes to form a curable resin composition layer having a thickness of 20 μm, and a cover film was attached onto a coated film, thereby obtaining a dry film. After that, the cover film was peeled off and thermally laminated on a copper foil, solid light exposure was performed at the optimal light exposure using the projection-type light exposure device equipped with a high-pressure mercury lamp (manufactured by Ushio, Inc.), and development was performed for 250 seconds using a 1% $Na_2CO_3$ aqueous solution (30° C.) under the condition of a spray pressure of 0.2 MPa. This substrate was irradiated with ultraviolet rays in a UV conveyor furnace under the condition of a cumulative light exposure of 1000 $mJ/cm^2$ and then heated at 180° C. for 60 minutes for curing. The cured coated film was peeled off from the obtained cured coated film-attached copper foil, thereby obtaining a film with the cured coated film.

The glass transition temperature of the obtained cured coated film was measured under the following conditions. The results are shown in Table 2.

Instrument: Dynamic viscoelasticity measuring instrument (DMA6100 manufactured by Seiko Instrument Inc.)
Measurement temperature: 30° C. to 300° C. (5° C./min)
Frequency: 1 Hz
Glass transition temperature: The maximum value of measured tan δ was regarded as the glass transition temperature.
A higher glass transition temperature is determined to be a higher heat resistance because elastic change occurs at a high temperature.
Evaluation standards are as described below.
⦾: 190° C. or higher
○: 180° C. or higher
Δ: 170° C. or higher
x: Lower than 170° C.

<Total Light Transmittance>

Each curable resin composition was diluted to an appropriate viscosity with methyl ethyl ketone and applied onto a carrier film. This was heated and dried with a hot air dryer at 80° C. for 30 minutes to form a curable resin composition layer having a thickness of 20 μm, and a cover film was attached onto a coated film, thereby obtaining a dry film. After that, the cover film was peeled off and thermally laminated on a glass substrate, solid light exposure was performed at the optimal light exposure using the projection-type light exposure device equipped with a high-pressure mercury lamp (manufactured by Ushio, Inc.), and development was performed for 250 seconds using a 1% $Na_2CO_3$ aqueous solution (30° C.) under the condition of a spray pressure of 0.2 MPa. This substrate was irradiated with ultraviolet rays in a UV conveyor furnace under the condition of a cumulative light exposure of 1000 mJ/cm$^2$ and then heated at 180° C. for 60 minutes for curing.

The total light transmittance of the obtained cured coated film was measured under the following conditions. The results are shown in Table 2.

Device: UV-visible spectrophotometer (Ubest-V-570DS manufactured by JASCO Corporation) and integrating sphere (ISN-470 manufactured by JASCO Corporation)

Measurement method: Based on ISO 13468

The evaluation method is as described below.

A: The total light transmittance was 95% or more.
B: The total light transmittance was 90% or more and less than 95%.
C: The total light transmittance was less than 90%.

<Haze Value>

Each curable resin composition was diluted to an appropriate viscosity with methyl ethyl ketone and applied onto a carrier film. This was heated and dried with a hot air dryer at 80° C. for 30 minutes to form a curable resin composition layer having a thickness of 20 μm, and a cover film was attached onto a coated film, thereby obtaining a dry film. The obtained dry film was thermally laminated on a glass substrate, solid light exposure was performed at the optimal light exposure using the projection-type light exposure device equipped with a high-pressure mercury lamp (manufactured by Ushio, Inc.), and development was performed for 250 seconds using a 1% $Na_2CO_3$ aqueous solution (30° C.) under the condition of a spray pressure of 0.2 MPa. This substrate was irradiated with ultraviolet rays in a UV conveyor furnace under the condition of a cumulative light exposure of 1000 mJ/cm$^2$ and then heated at 180° C. for 60 minutes for curing.

The haze value of the obtained cured coated film was measured under the following conditions. The results are shown in Table 2.

Device: UV-visible spectrophotometer (Ubest-V-570DS manufacture d by JASCO Corporation) and integrating sphere (ISN-470 manufactured by JASCO Corporation)

Measurement method: Based on ISO 14782

The evaluation method is as described below.

A: The haze value was less than 2.0%.
B: The haze value was 2.0% or more and less than 5.0%.
C: The haze value was 5.0% or more.

[Table 2]

TABLE 2

Compositions and test results of curable resin compositions (2)

| In term of solid content | Example 6 | Example 7 | Example 8 | Example 9 | Example 10 | Example 11 | Comparative Example 4 | Comparative Example 5 | Comparative Example 6 | Comparative Example 7 |
|---|---|---|---|---|---|---|---|---|---|---|
| (A) Amide-imide resin 1 | 100 | 100 | 100 | 100 | 100 | 100 | | | | |
| (A') Amide-imide resin 2 | | | | | | | 100 | | | 50 |
| (A') Amide-imide resin 3 | | | | | | | | 100 | | |
| (A) Amide-imide resin 4 | | | | | | | | | 100 | |
| (B) Resin having ethylenic double bond 1 | 15 | 15 | 15 | 15 | 10 | 15 | 15 | 15 | 15 | 15 |
| (B) Resin having ethylenic double bond 2 | | | | | 5 | | | | | |
| (C) Photopolymerization initiator 1 | 5 | 5 | 5 | | 5 | 5 | 5 | 5 | 5 | 5 |
| (C) Photopolymerization initiator 2 | 0.5 | 0.5 | 0.5 | | 0.5 | 0.5 | 0.5 | 05 | 0.5 | 0.5 |
| (C) Photopolymerization initiator 3 | | | | 10 | | | | | | |
| (D) Thermosetting resin 1 | 20 | 20 | 20 | 20 | 20 | | 20 | 20 | 20 | 20 |
| (D) Thermosetting resin 2 | | | | | | 20 | | | | |
| (E) Carboxyl group-containing resin 1 | | 100 | | | | | | | | |
| (E) Carboxyl group-containing resin 2 | 100 | | 50 | 100 | 100 | 100 | 100 | 100 | 100 | 100 |
| Inorganic particles 1 | 20 | 20 | 20 | 20 | 20 | 20 | 20 | 20 | 20 | 20 |
| Inorganic particles 2 | 20 | 20 | 20 | 20 | 20 | 20 | 20 | 20 | 20 | 20 |
| Resolution | ◎ | ◎ | ◎ | ◎ | ◎ | ◎ | X | ○ | X | Δ |
| Developability | ◎ | ◎ | ◎ | ◎ | ◎ | ◎ | X | Δ | ○ | Δ |
| Heat resistance (° C.) | 180 | 190 | 195 | 180 | 170 | 200 | 180 | 180 | 195 | 160 |
| | ○ | ◎ | ◎ | ○ | Δ | ◎ | ○ | ○ | ◎ | X |
| Total light transmittance | A | A | A | A | A | A | B | B | C | B |
| Haze value | A | A | A | A | A | A | C | B | B | B |

(A) Amide-imide resin 1: Synthesis Example 1, Mn = 800
(A') Amide-imide resin 2: Synthesis Example 2, Mn = 5800
(A') Amide-imide resin 3: Synthesis Example 3, Mn = 1500
(A) Amide-imide resin 4: Synthesis Example 4, Mn = 800
(B) Resin having ethylenic double bond 1: Dipentaerythritol hexaacrylate
(B) Resin having ethylenic double bond 2: Ethylene oxide-modified trimethylolpropane triacrylate
(C) Photopolymerization initiator 1: 2 Methyl-1-(4-methylthiophenyl)-2 morpholinopropane-1 one
(C) Photopolymerization initiator 2: 2,4-Diethylthioxanthone
(C) Photopolymerization initiator 3: 2,4,6-Trimethylbenzoyldiphenylphosphine oxide
(D) Thermosetting resin 1: Dicyclopentadiene skeleton-containing epoxy resin; HP-7200 (manufactured by DIC Corporation)
(D) Thermosetting resin 2: Naphthol-modified epoxy resin; NC-7000L (manufactured by Nippon Kayaku Co., Ltd.)
(E) Carboxyl group-containing resin 1: Synthesis Example 5
(E) Carboxyl group-containing resin 2: Synthesis Example 6
Inorganic particles 1: Barium sulfate
Inorganic particles 2: silica

The invention claimed is:

1. A curable resin composition, comprising:
    an amide-imide resin;
    a compound having an ethylenic double bond;
    a photopolymerization initiator; and
    a carboxyl group-containing resin having no amide-imide structures such that the carboxyl group-containing resin has a structure that is different from a structure of the amide-imide resin,
    wherein the amide-imide resin is a reaction product of an isocyanurate-type polyisocyanate synthesized from an isocyanate having an aliphatic structure and a tricarboxylic acid anhydride and has a number-average molecular weight in a range of 500 to 1000, and the carboxyl group-containing resin has a content in a range of 50 parts by mass to 100 parts by mass with respect to 100 parts by mass of the amide-imide resin.

2. The curable resin composition according to claim 1, wherein the tricarboxylic acid anhydride has an aliphatic structure.

3. The curable resin composition according to claim 1, wherein the amide-imide resin has a number-average molecular weight in a range of 500 to 800.

4. The curable resin composition according to claim 1, further comprising:
    a thermosetting resin.

5. The curable resin composition according to claim 3, wherein when a cured product of the curable resin composition has a film thickness of 20 um, the cured product has a total light transmittance of 95% or more and a haze value of less than 2.0%.

6. A dry film, comprising:
    a resin layer formed of the curable resin composition of claim 1.

7. A cured product produced by a process comprising curing the curable resin composition of claim 1.

8. An electronic component, comprising:
    the cured product of claim 7.

9. A cured product produced by a process comprising curing the resin layer of the dry film of claim 6.

10. The curable resin composition according to claim 2, further comprising:
    a thermosetting resin.

11. The curable resin composition according to claim 4, wherein when a cured product of the curable resin composition has a film thickness of 20 um, the cured product has a total light transmittance of 95% or more and a haze value of less than 2.0%.

12. A dry film, comprising:
    a resin layer formed of the curable resin composition of claim 2.

13. A cured product produced by a process comprising curing the curable resin composition of claim 2.

14. An electronic component, comprising:
    the cured product of claim 13.

15. A cured product produced by a process comprising curing the resin layer of the dry film of claim 12.

16. The curable resin composition according to claim 3, further comprising:
    a thermosetting resin.

17. A dry film, comprising:
    a resin layer formed of the curable resin composition of claim 3.

18. A cured product produced by a process comprising curing the curable resin composition of claim 3.

19. An electronic component, comprising:
    the cured product of claim 18.

20. A cured product produced by a process comprising curing the resin layer of the dry film of claim 17.

* * * * *